(12) United States Patent
Shin et al.

(10) Patent No.: US 12,225,809 B2
(45) Date of Patent: Feb. 11, 2025

(54) COATING COMPOSITION INCLUDING FUNCTIONALIZED GRAPHENE OXIDE, METHOD FOR FORMING STACKED STRUCTURE USING THE SAME AND METHOD FOR MANUFACTURING DISPLAY DEVICE USING THE SAME

(71) Applicants: Samsung Display Co., LTD., Yongin-si (KR); DONGJIN SEMICHEM CO., LTD., Hwaseong-si (KR)

(72) Inventors: Hee Kyun Shin, Incheon (KR); Dong Kyun Seo, Seoul (KR); Jun Ho Sim, Hwaseong-si (KR); Woo Jin Cho, Yongin-si (KR); Byung Hoon Kang, Hwaseong-si (KR); Seung Jun Moon, Cheonan-si (KR); Sun Chan Park, Hwaseong-si (KR); Hee Won Seo, Hwaseong-si (KR); Ji Eun Cho, Hwaseong-si (KR); Kyu Soon Shin, Hwaseong-si (KR)

(73) Assignees: SAMSUNG DISPLAY CO., LTD., Yongin-si (KR); DONGJIN SEMICHEM CO., LTD., Hwaseong-si (KR)

( * ) Notice: Subject to any disclaimer, the term of this patent is extended or adjusted under 35 U.S.C. 154(b) by 537 days.

(21) Appl. No.: 17/029,855

(22) Filed: Sep. 23, 2020

(65) Prior Publication Data
US 2021/0104672 A1 Apr. 8, 2021

(30) Foreign Application Priority Data

Oct. 7, 2019 (KR) .................. 10-2019-0123941

(51) Int. Cl.
*H10K 71/80* (2023.01)
*C09D 1/00* (2006.01)
(Continued)

(52) U.S. Cl.
CPC ............ *H10K 71/80* (2023.02); *C09D 1/00* (2013.01); *C09D 7/63* (2018.01); *H10K 50/8445* (2023.02);
(Continued)

(58) Field of Classification Search
CPC ............ H01L 51/003; H01L 51/0097; H01L 51/5256; H01L 51/56; H01L 51/5253;
(Continued)

(56) References Cited

U.S. PATENT DOCUMENTS 10,029,215 B2 7/2018 Park et al.
2011/0315204 A1 12/2011 Gleason et al.
(Continued)

FOREIGN PATENT DOCUMENTS

CN 106061593 10/2016
CN 106102883 11/2016
(Continued)

OTHER PUBLICATIONS

Ma et al. "Functionalization and Reduction of Graphene Oxide with p-Phenylene Diamine for Electrically Conductive and Thermally Stable Polystyrene Composites", 2012. ACS Applied Materials & Interfaces, p. 1948-1953. (Year: 2012).*
(Continued)

*Primary Examiner* — Melissa S Swain
*Assistant Examiner* — Catriona M Corallo
(74) *Attorney, Agent, or Firm* — KILE PARK REED & HOUTTEMAN PLLC

(57) ABSTRACT

The present disclosure is directed to a coating composition including a graphene oxide and a solvent. At least one of a carboxyl group and an epoxide group of the graphene oxide is functionalized by an amine. The amine has an activation energy to an epoxide group of the graphene oxide of about −3 kcal/mol to about 8 kcal/mol. A method of forming a
(Continued)

stacked structure using the coating composition is provided. A method of manufacturing a display device using the coating composition is provided.

17 Claims, 12 Drawing Sheets

(51) Int. Cl.
- C09D 7/63 (2018.01)
- H10K 50/844 (2023.01)
- H10K 71/00 (2023.01)
- H10K 77/10 (2023.01)
- B82Y 30/00 (2011.01)
- B82Y 40/00 (2011.01)

(52) U.S. Cl.
CPC ........... H10K 71/00 (2023.02); H10K 77/111 (2023.02); *B82Y 30/00* (2013.01); *B82Y 40/00* (2013.01); *H10K 50/844* (2023.02)

(58) Field of Classification Search
CPC . C09D 7/63; C09D 1/00; B82Y 30/00; B82Y 40/00
USPC ........................................................ 106/499
See application file for complete search history.

(56) References Cited

U.S. PATENT DOCUMENTS

| | | | |
|---|---|---|---|
| 2015/0021631 A1 | 1/2015 | Huh et al. | |
| 2017/0015483 A1 | 1/2017 | Park et al. | |

FOREIGN PATENT DOCUMENTS

| | | | |
|---|---|---|---|
| KR | 10-2011-0115539 | 10/2011 | |
| KR | 10-2012-0105380 | 9/2012 | |
| KR | 10-2013-0125668 | 11/2013 | |
| KR | 10-2013-0134446 | 12/2013 | |
| KR | 1020140023730 | 2/2014 | |
| KR | 10-2015-0009289 | 1/2015 | |
| KR | 10-2015-0029045 | 3/2015 | |
| KR | 10-2015-0105236 | 9/2015 | |
| KR | 10-2018-0000781 | 1/2018 | |
| WO | 2014027833 | 2/2014 | |
| WO | WO-2018187588 A1 * | 10/2018 | ........... B01D 53/228 |

OTHER PUBLICATIONS

Yong et al. English translation of KR 2013/0125668 A. (Year: 2013).*
Saini et al. "Spectroscopic and electronic properties of polyallylamine functionalized graphene oxide films", 2018. Vacuum, p. 110-114. (Year: 2018).*
Liu et al. "Reduced Graphene Oxide-Based Double Network Polymeric Hydrogels for Pressure and Temperature Sensing". Sensors 2018, 18, 3162. (Year: 2018).*
Satti et al. "Improvement of mechanical properties of graphene oxide/poly(allylamine) composites by chemical crosslinking". Carbon 48 (2010) p. 3376-3381. (Year: 2010).*
Stankovich et al. "Synthesis of graphene-based nanosheets via chemical reduction of exfoliated graphite oxide". Carbon 45 (2007) p. 1558-1565. (Year: 2007).*
Korean Office Action with English translation for Korean Patent Application No. 10-2019-0123941, dated Apr. 29, 2024.

* cited by examiner

COATING COMPOSITION INCLUDING FUNCTIONALIZED GRAPHENE OXIDE, METHOD FOR FORMING STACKED STRUCTURE USING THE SAME AND METHOD FOR MANUFACTURING DISPLAY DEVICE USING THE SAME

CROSS-REFERENCE TO RELATED APPLICATION(S)

This application claims priority to and benefits of Korean Patent Application No. 10-2019-0123941 under 35 U.S.C. § 119, filed on Oct. 7, 2019 in the Korean Intellectual Property Office, the entire contents of which are incorporated herein by reference.

BACKGROUND

1. Technical Field

Embodiments are directed to a coating composition including a graphene oxide. More particularly, exemplary embodiments are directed to a coating composition including a graphene oxide, a method for forming a stacked structure using the coating composition, and a method for manufacturing a display device using the coating composition.

2. Description of the Related Art

Recent research and development are being conducted for a flexible display device in order to improve portability and variability of a display device and to implement various designs.

In order to obtain the flexible display device, a polymer substrate having flexibility may be used. For example, after a carrier substrate is combined with the polymer substrate, a display element part may be formed on the polymer substrate. Thereafter, the carrier substrate may be separated from the polymer substrate to form the flexible display device.

One of the known methods for separating the carrier substrate and the polymer substrate may use a laser. However, when the laser is used for separating the carrier substrate from the polymer substrate, the display element part may be damaged, and uniformity of separation may be deteriorated.

In order to solve this problem, a method is being developed to form a barrier adhesion layer, which is mechanically separable, by coating a graphene oxide flake between the carrier substrate and the polymer substrate.

SUMMARY

Embodiments provide a coating composition including a functionalized graphene oxide, which is capable of improving a surface roughness and a transmittance uniformity of a graphene oxide coating layer.

Embodiments provide a method for forming a stacked structure using the coating composition.

Embodiments provide a method for manufacturing a display device using the coating composition.

According to an embodiment, a coating composition may include a graphene oxide, and a solvent. At least one of a carboxyl group and an epoxide group of the graphene oxide may be functionalized by an amine. The amine may have an activation energy to an epoxide group of the graphene oxide of about −3 kcal/mol to about 8 kcal/mol.

In an embodiment, a zeta potential of the coating composition may be about +30 mV to about +60 mV. A solution conductivity of the coating composition may be about 0.001 mS/cm to about 0.05 mS/cm.

In an embodiment, the coating composition may have a graphene oxide content of about 0.00001 wt % to about 4 wt %.

In an embodiment, the amine may be represented by Formula 1. In Formula 1, R1 may represent a straight or branched alkylene group of 3 to 10 carbon atoms, an aromatic ring group, an aliphatic ring group, or a combination thereof. In Formula 1, R2 and R3 may be independently hydrogen or a methyl group.

<Formula 1>

In an embodiment, the amine may include at least one selected from the group consisting of N,N-dimethyl-p-phenylene diamine, p-phenylene diamine, 3-dimethylamino-1-propyl amine, and 2,2-(1,2-phenylene)bis(1H-benzo[d]imidazol-5-amine).

In an embodiment, the graphene oxide may have a thickness of about 0.5 nm to about 2 nm.

In an embodiment, the coating composition may further include a water-soluble polymer including at least one selected from the group consisting of PSS (poly(styrene sulfonate)), PEI (polyetherimide), PAA (polyallylamine), PDDA (poly(diallyldimethylammonium chloride)), PNIPAM (poly(N-isopropyl acrylamide)), CS (Chitosan), PMA (poly(methacrylic acid)), PVS (poly(vinyl sulfate)), poly(amic acid), and PAH (poly(allylamine hydrochloride)).

In an embodiment, a weight ratio of the water-soluble polymer to the graphene oxide may be about 0.01 to 1.

In an embodiment, the solvent may include at least one selected from the group consisting of heptane, hexane, ethanol, methanol, butanol, propanol, methylene chloride, trichloroethylene, ethyl acetate, acetone, methylethylketone, diethylamine, di-isopropylamine, isopropylamine, and water.

According to an embodiment, a method for forming a stacked structure is provided. According to the method, a first coating composition including a positively electric-charged graphene oxide may be provided on a substrate to form a first coating layer. A second coating composition including a negatively electric-charged graphene oxide may be provided on a substrate to form a second coating layer interlayer-bonded to the first coating layer by electrostatic force. At least one of a carboxyl group and an epoxide group of the positively electric-charged graphene oxide may be functionalized by an amine. The amine may have an activation energy to an epoxide group of graphene oxide of about −3 kcal/mol to about 8 kcal/mol. A zeta potential of the first coating composition may be about +30 mV to about +60 mV. A solution conductivity of the first coating composition may be about 0.001 mS/cm to 0.05 about mS/cm.

In an embodiment, the amine may include at least one selected from the group consisting of N,N-dimethyl-p-phenylene diamine, p-phenylene diamine, 3-dimethylamino-1-propyl amine, and 2,2-(1,2-phenylene)bis(1H-benzo[d]imidazol-5-amine).

In an embodiment, the positively electric-charged graphene oxide may have a thickness of about 0.5 nm to about 2 nm.

In an embodiment, a zeta potential of the second coating composition may be about −30 mV to about −60 mV. A solution conductivity of the second coating composition may be about 0.001 mS/cm to about 0.05 mS/cm.

In an embodiment, the negatively electric-charged graphene oxide may have a thickness of about 0.5 nm to about 1 nm.

In an embodiment, the negatively electric-charged graphene oxide may have an oxygen content of about 35 wt % to about 48 wt %.

According to an embodiment, a method for manufacturing a display device is provided. According to the method, a first coating composition including a positively electric-charged graphene oxide may be provided on a carrier substrate to form a first graphene oxide layer. A second coating composition including a negatively electric-charged graphene oxide may be provided on the carrier substrate to form a second graphene oxide layer interlayer-bonded to the first graphene oxide layer by electrostatic force. A flexible substrate may be formed on a barrier adhesion layer which may include the first graphene oxide layer and the second graphene oxide layer. A display element part may be formed on the flexible substrate. A protective film may be formed on the display element part. The flexible substrate may be separated from the carrier substrate. At least one of a carboxyl group and an epoxide group of the positively electric-charged graphene oxide may be functionalized by an amine. The amine may have an activation energy to an epoxide group of graphene oxide of about −3 kcal/mol to about 8 kcal/mol. A zeta potential of the first coating composition may be about +30 mV to about +60 mV. A solution conductivity of the first coating composition may be about 0.001 mS/cm to 0.05 about mS/cm.

In an embodiment, the flexible substrate may include at least one selected from the group consisting of polyester, polyvinyl, polycarbonate, polyethylene, polypropylene, polyacetate, polyimide, polyethersulphone, polyacrylate, polyethylenenaphthelate, and polyethyleneterephehalate In an embodiment, the amine may include at least one selected from the group consisting of N,N-dimethyl-p-phenylene diamine, p-phenylene diamine, 3-dimethylamino-1-propyl amine, and 2,2-(1,2-phenylene)bis(1H-benzo[d]imidazol-5-amine).

In an embodiment, the positively electric-charged graphene oxide may have a thickness of about 0.5 nm to about 2 nm.

In an embodiment, the negatively electric-charged graphene oxide may have an oxygen content of about 35 wt % to about 48 wt %.

According to embodiments, a thickness of a positively electric-charged graphene oxide may be reduced. Thus, a coating composition including graphene oxide flakes highly-dispersed therein may be provided.

Furthermore, when the coating composition is used for forming an barrier adhesion layer, uniformity of a barrier adhesion layer may be improved, and a surface roughness of the barrier adhesion layer may be reduced. Thus, a required thickness of the barrier adhesion layer may be reduced, and a wrinkle of the barrier adhesion layer may be prevented, and undesired bonding of a carrier substrate and a flexible substrate may be prevented.

BRIEF DESCRIPTION OF THE DRAWINGS

Aspects of one or more embodiments of the invention will be more clearly understood from the following detailed description taken in conjunction with the accompanying drawings. In the drawings.

DETAILED DESCRIPTION OF THE EMBODIMENTS

Figure 1:
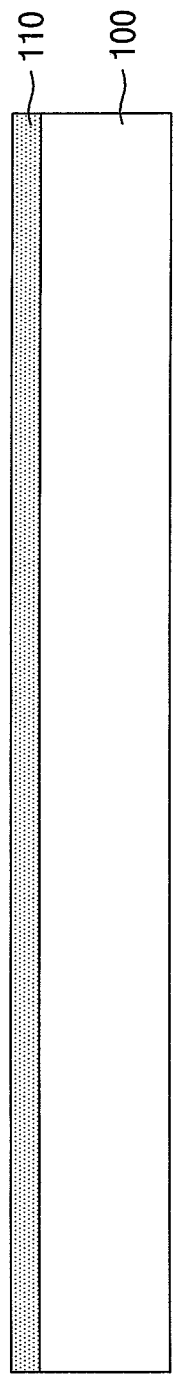
FIG. 1 is a schematic cross-sectional view illustrating a barrier adhesion layer formed on a carrier substrate according to an embodiment.

A coating composition including a functionalized graphene oxide, a method for forming a stacked structure, and a method for manufacturing a display device according to embodiments of the invention will be described hereinafter with reference to the accompanying drawings, in which some embodiments are shown. Same or similar reference numerals may be used for same or similar elements in the drawings.

The invention may have various modifications and may be embodied in different forms, and example embodiments will be explained in detail with reference to the accompany drawings. The invention may, however, be embodied in different forms and should not be construed as limited to the embodiments set forth herein. Rather, all modifications, equivalents, and substituents which are included in the spirit and technical scope of the invention should be included.

In the drawings, the dimensions of structures are exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the teachings of the invention. Similarly, a second element could be termed a first element. As used herein, the singular forms are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or".

The phrase "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be further understood that the terms "comprises," "comprising," "includes," and/or "including," when used in this specification, specify the presence of stated features, numerals, steps, operations, elements, parts, or the combination thereof, but do not preclude the presence or addition of one or more other features, numerals, steps, operations, elements, parts, or the combination thereof.

It will also be understood that when a layer, a film, a region, a plate, etc. is referred to as being "on" or "above" another part, it can be "directly on" the other part, or intervening layers may also be present. It will also be understood that when a layer, a film, a region, a plate, etc. is referred to as being "under" or "below" another part, it can be "directly under" the other part, or intervening layers may also be present. When an element is referred to as being disposed "on" another element, it can be disposed under the other element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Method for Manufacturing Functionalized Graphene Oxide

An embodiment provides a method for manufacturing a functionalized graphene oxide. Firstly, a graphene oxide is prepared.

The graphene oxide may be prepared by conventionally known methods. For example, according to the Hummer method or the like, a graphite may be oxidized, and a graphene oxide may be obtained from the graphite oxide through intercalation and exfoliation. The graphene oxide may have a flake shape.

The graphene oxide may preferably have a small thickness. For example, the graphene oxide may include 1 to 5 layers, and may preferably include 1 layer or 2 layers. For example, the graphene oxide may have a thickness equal to or less than about 5 nm. In an embodiment the graphene oxide may have a thickness of about 0.5 nm to about 1 nm.

The graphene oxide may react with amine to be functionalized. For example, the graphene oxide may have a reactive functional group such as a hydroxyl group, an epoxide group, or a carboxyl group, as illustrated in the following structural formula.

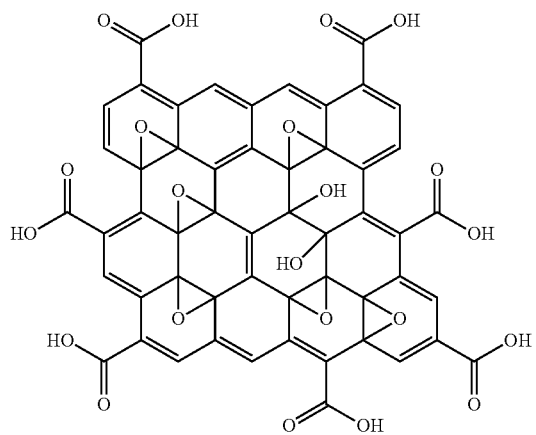

<structural formula of graphene oxide>

The amine may have an activation energy to an epoxide group of the graphene oxide equal to or less than about 8 kcal/mol. For example, the activation energy of the amine to an epoxide group may be about −3 kcal/mol to about 8 kcal/mol. When the activation energy of the amine to an epoxide group is more than 8 kcal/mol, reaction for functionalization may not be sufficient at a low temperature. When the reaction for functionalization is performed at a high temperature, the thickness of the graphene oxide may be increased by aggregation. Thus, coating uniformity of a layer including the graphene oxide may be reduced. In an embodiment, a weight average molecular weight of the amine may be equal to or less than about 200 g/mol.

For example, the amine may be a diamine compound having two amino groups. For example, the amine may be represented by Formula 1.

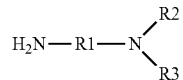

<Formula 1>

In Formula 1, R1 may be a straight or branched alkylene group of 3 to 10 carbon atoms, an aromatic ring group, an aliphatic ring group, or a combination thereof. R2 and R3 may be independently hydrogen or a methyl group.

The amine may react with a carboxyl group of the graphene oxide to form a functionalized group represented by Formula 2. The amine may react with an epoxide group of the graphene oxide to form a functionalized group represented by Formula 3 and a hydroxyl group. The amine may not react with the hydroxyl group of the graphene oxide.

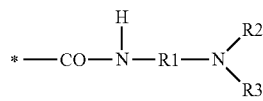

<Formula 2>

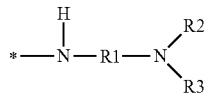

<Formula 3>

For example, the amine may include N,N-dimethyl-p-phenylene diamine (DMPD, activation energy (Ea) to an epoxide group=7.6 kcal/mol), p-phenylene diamine (Ea to an epoxide group=7.3 kcal/mol), 3-dimethylamino-1-propyl amine (DAPA, Ea to an epoxide group=3.5 kcal/mol), and 2,2'-(1,2-phenylene)bis(1H-benzo[d]imidazol-5-amine) (Ea to an epoxide group=−2.3 kcal/mol). These may be used each alone or in a combination thereof. For example, the activation energy of the amine to an epoxide group of the graphene oxide may be calculated on a surface of coronene ($C_{24}H_{12}$) according to electronic structure calculation using Hatree-Foch theory.

When the amine has a low activation energy, the graphene oxide may be functionalized at a relatively low temperature. Thus, particle aggregation due to synthetic heat may be prevented, and a functionalized graphene oxide having a thickness of a monolayer level or a bilayer level may be obtained.

For example, a reaction of the graphene oxide and the amine may be performed at a temperature equal to or less than about 100° C. In an embodiment, the reaction of the graphene oxide and the amine may be performed at a temperature which ranges from room temperature to about 80° C. In another embodiment, the reaction of the graphene oxide and the amine may be performed at a temperature which ranges from room temperature to about 60° C. For example, the room temperature may be about 15° C. to about 25° C.

In an embodiment, the reaction of the graphene oxide and the amine may be performed in an aqueous solution. However, the embodiments are not limited thereto.

A thickness of the functionalized graphene oxide may depend on the thickness of the graphene oxide before the functionalization reaction, and may be increased by the functionalization reaction. For example, the thickness of the functionalized graphene oxide may be about 0.5 nm to about 2 nm.

For example, a diameter of the functionalized graphene oxide may be about 0.8 μm to about 100 μm.

For example, an oxygen content of the functionalized graphene oxide may be about 10 wt % to about 40 wt %, and a nitrogen content of in the functionalized graphene oxide may be about 2 wt % to about 10 wt %. In an embodiment, the oxygen content of the functionalized graphene oxide may be about 10 wt % to about 30 wt %, and the nitrogen content of the functionalized graphene oxide may be about 3 wt % to about 7 wt %. However, the embodiments are not limited thereto.

The functionalized graphene oxide may be used for forming a stacked structure with a negatively charged graphene oxide interlayer-bonded thereto by an electrostatic force. When the functionalized graphene oxide has a small thickness of a monolayer level or a bilayer level, a coating composition with high dispersion may be obtained because the Van der Waals force is reduced. Furthermore, when the stacked structure is formed, the stacked structure may be interlayer-bonded substantially by only an electrostatic force.

Thus, a surface roughness of a coating layer may be reduced, and coating uniformity may be improved.

Coating Composition Including Functionalized Graphene Oxide

A coating composition according to an embodiment includes a functionalized graphene oxide.

The coating composition may include a solvent or a dispersion agent, which may include at least one selected from the consisting of heptane, hexane, ethanol, methanol, butanol, propanol, methylene chloride, trichloroethylene, ethyl acetate, acetone, methylethylketone, diethylamine, di-isopropylamine, isopropylamine, and water. In an embodiment, the coating composition may include water.

The functionalized graphene oxide may be functionalized by an amine to be positively electric-charged. The amine may be a diamine compound having an activation energy to an epoxide group of a graphene oxide that is equal to or less than about 8 kcal/mol. For example, a thickness of the functionalized graphene oxide may be about 0.5 nm to about 2 nm.

In an embodiment, a zeta potential of the coating composition may be about +30 mV to about +60 mV, and a solution conductivity of the coating composition may be about 0.001 mS/cm to about 0.05 mS/cm. The coating composition may have a content of the functionalized graphene oxide of about 0.00001 wt % to about 4 wt %. When the content of the functionalized graphene oxide is less than about 0.00001 wt %, it may be difficult to form a coating layer that fully covers an object. When the content of the functionalized graphene oxide is more than about 4 wt %, dispersion may be deteriorated.

When the zeta potential of the coating composition is less than about +30 mV, interlayer bonding by electrostatic force may be reduced to deteriorate the uniformity of a coating layer.

When the solution conductivity of the coating composition is more than about 0.05 mS/cm, dispersion may be deteriorated, or a thickness of the functionalized graphene oxide may be large. Thus, the uniformity of a coating layer may be deteriorated The coating composition may further include a water-soluble polymer. The water-soluble polymer may function as a surfactant, and may functionalize the graphene oxide to increase the zeta potential of the coating composition.

For example, the water-soluble polymer may include at least one selected from the group consisting of PSS (poly (styrene sulfonate)), PEI (polyetherimide), PAA (polyallylamine), PDDA (poly(diallyldimethylammonium chloride)), PNIPAM (poly(N-isopropyl acrylamide), CS (Chitosan), PMA (poly(methacrylic acid)), PVS (poly(vinyl sulfate)), poly(amic acid), and PAH (poly(allylamine hydrochloride)). However, the embodiments are not limited thereto.

A weight ratio of the water-soluble polymer to the functionalized graphene oxide may be about 0.01 to 1. When the weight ratio of the water-soluble polymer to the functionalized graphene oxide is less than about 0.01, dispersion may be hardly improved. When the weight ratio of the water-soluble polymer to the functionalized graphene oxide is more than about 1, coating uniformity may be deteriorated by the water-soluble polymer.

Method for Manufacturing a Display Device

FIGS. 1 to 13 are schematic cross-sectional views illustrating a method for manufacturing a display device according to an embodiment.

Referring to FIG. 1, a barrier adhesion layer 110 is formed on a carrier substrate 100.

The carrier substrate 100 supports a flexible substrate in the process of manufacturing a flexible display device. In an embodiment, for example, the carrier substrate 100 may include glass, quartz, silicon, polymers, or the like.

The barrier adhesion layer 110 may include a barrier material. In an embodiment, the barrier adhesion layer 110 may include graphene oxide having a flake shape.

Graphene oxide has physical characteristics similar to graphene and has superior dispersion ability. Thus, an aqueous solution process may be used for forming a thin layer by using the graphene oxide.

In an embodiment, the barrier adhesion layer 110 may be formed through a layer-by-layer method. For example, the barrier adhesion layer 110 may be formed by alternately depositing a graphene oxide layer which is charged with a first electric charge, and a second graphene oxide layer which is charged with a second electric charge having an opposite polarity to the first electric charge. The first electric charge may be one of a negative electric charge or a positive electric charge, and the second electric charge is the other. The graphene oxide layers electric-charged with opposite polarities may be alternatively combined with each other by electrostatic force. The method for forming the barrier adhesion layer 110 will be explained more fully with reference to FIGS. 2 to 4.

Figure 2:
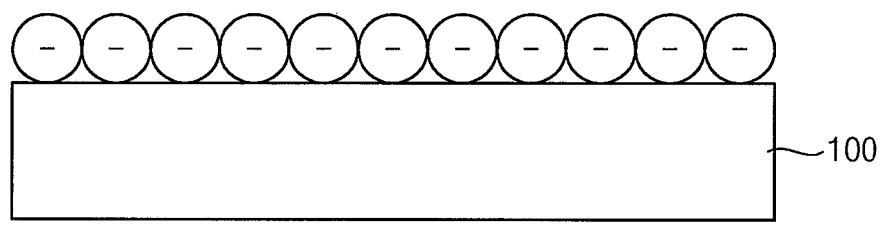
FIGS. 2 to 4 are schematic cross-sectional views illustrating a method for forming a barrier adhesion layer according to an embodiment.
Figure 3:
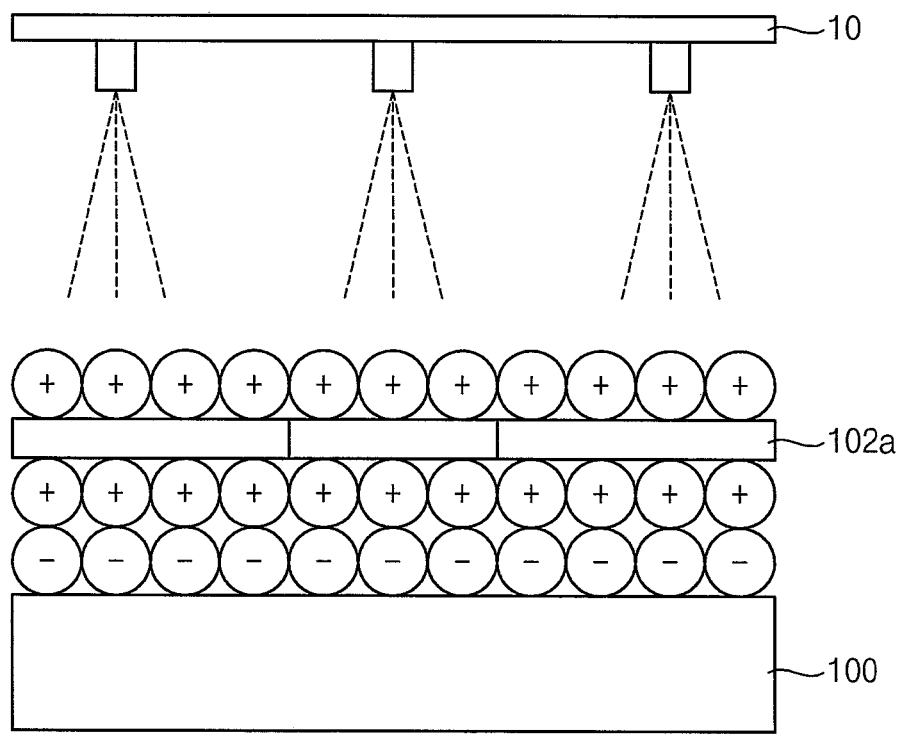
Figure 4:
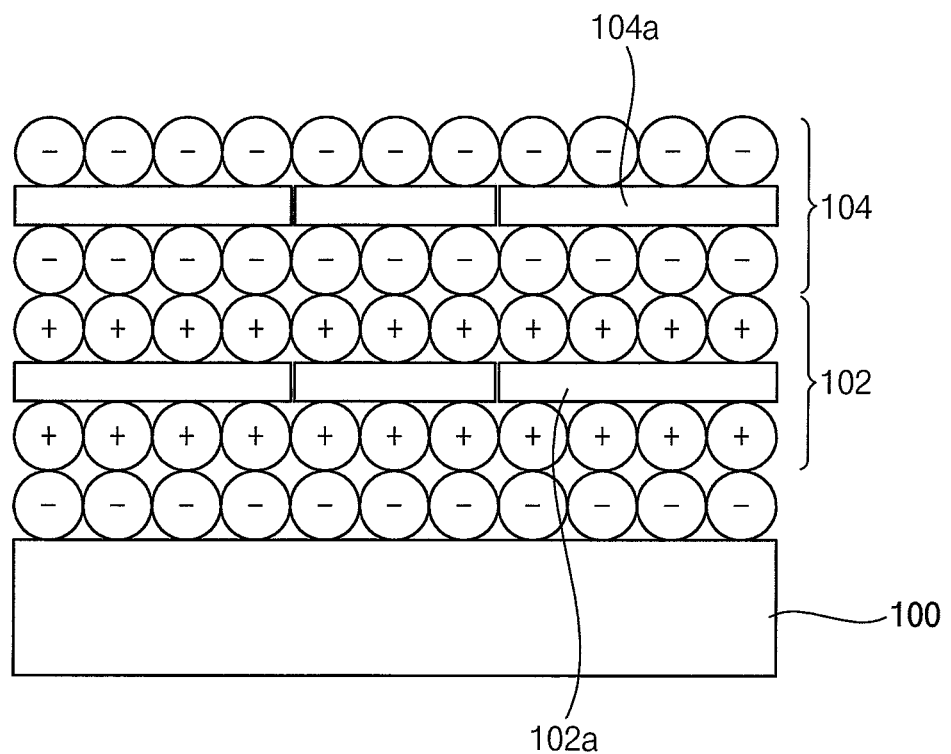

FIGS. 2 to 4 are schematic cross-sectional views illustrating a method for forming a barrier adhesion layer according to an embodiment. The method of forming a barrier adhesion layer may be used for forming a stacked structure interlayer-bonded by electrostatic force by using graphene oxide.

Referring to FIG. 2, a surface of a carrier substrate 100 is electric-charged. The surface of the carrier substrate 100 may be positively electric-charged or negatively electric-charged. When the surface of the carrier substrate 100 is electric-charged, a graphene oxide electric-charged with the opposite polarity may be easily combined with the surface of the carrier substrate 100 by electrostatic force.

In an embodiment, the surface of the carrier substrate 100 may be negatively electric-charged, and positively electric-charged graphene oxide may be adhered to the surface of the carrier substrate 100. However, the embodiments are not limited thereto. In another embodiment, the surface of the carrier substrate 100 may be positively electric-charged, and negatively electric-charged graphene oxide may be adhered to the surface of the carrier substrate 100.

For example, in order to charge the surface of the carrier substrate 100 with a negative electric charge, the surface of the carrier substrate 100 may be treated with an anionic polymer electrolyte such as poly(4-styrenesulfonate) or poly(acrylic)acid, or treated with sulfuric acid/hydrogen peroxide, oxygen plasma, or the like.

For example, in order to charge the surface of the carrier substrate 100 with a positive electric charge, the surface of the carrier substrate 100 may be treated with a cationic polymer electrolyte such as PAH, PDDA, or poly(ethyleneimine), or treated with plasma of an inert gas such as argon.

Referring to FIG. 3, a first graphene oxide 102a which is positively electric-charged is adhered to the surface of the carrier substrate 100 which is negatively electric-charged. For example, a first coating composition including the first graphene oxide 102a may be provided on the surface of the carrier substrate 100.

The first coating composition including the first graphene oxide 102a may be substantially same as the coating composition including a functionalized graphene oxide, which is previously explained. Thus, any duplicated explanation may be omitted.

In an embodiment, the first coating composition may be applied through a dip coating method, a spray coating method, a spin coating method, a screen coating method, an offset printing method, an inkjet printing method, a knife coating method, a gravure coating method, or the like. In an embodiment, the first coating composition may be provided by a spray 10.

The first graphene oxide 102a, which is positively electric-charged, may be combined with the surface of the carrier substrate 100 by Coulomb's force (electrostatic force). If the surface of the carrier substrate 100 is entirely covered with graphene oxide flakes, a thickness of a graphene oxide layer is barely increased because of electrostatic repulsive forces between graphene oxide flakes. Thus, a graphene oxide layer having a very small thickness may be formed.

Thereafter, drying and rinsing may be performed.

Referring to FIG. 4, a second graphene oxide layer 104 is formed on a first graphene oxide layer 102. The first graphene oxide layer 102 may include a first graphene oxide 102a which is positively electric-charged. The second graphene oxide layer 104 may include a second graphene oxide 104a which is negatively electric-charged, and may be formed through a same layer as the first graphene oxide layer 102.

A second coating composition including a second graphene oxide 104a, which is negatively electric-charged, may be used for forming the second graphene oxide layer 104.

In an embodiment, a zeta potential of the second coating composition may be about −30 mV to about −60 mV, and a solution conductivity of the second coating composition may be about 0.001 mS/cm to about 0.05 mS/cm. The second coating composition may have a content of the graphene oxide of about 0.00001 wt % to about 4 wt %.

In an embodiment, the negatively electric-charged graphene oxide may have an oxygen content of about 35 wt % to about 50 wt %. In an embodiment, the negatively electric-charged graphene oxide may have an oxygen content of about 38 wt % to about 48 wt %. However, the embodiments are not limited thereto. When the negatively electric-charged graphene oxide has an oxygen content of less than about 35 wt %, it may be difficult to obtain the desired zeta potential. When the negatively electric-charged graphene oxide has an oxygen content of more than about 50 wt %, a heat resistance may be reduced thereby causing heat decomposition in a baking process. The oxygen content of the negatively electric-charged graphene oxide may be adjusted by changing an oxidation condition or an exfoliation condition in the Hummer method.

For example, the negatively electric-charged graphene oxide may be obtained from an oxidized graphite through intercalation and exfoliation according to the Hummer method or the like. In an embodiment, the negatively electric-charged graphene oxide may be substantially same as a graphene oxide before functionalization in the formation of the functionalized graphene oxide.

The above processes may be repeated to form a stacked structure of graphene oxide layers electric-charged with opposite polarities and interlayer-bonded to each other by electrostatic force. For example, a thickness of the stacked structure may be about 1.5 nm to about 20 nm. The stacked structure may be obtained from repeating a combination of the positively electric-charged graphene oxide and the negatively electric-charged graphene oxide by 1 to 10 times.

The stacked structure may be used for a barrier adhesion layer for separating a carrier substrate and a flexible substrate in a method for manufacturing a display device, which will be more fully explained in the following.

Figure 5:
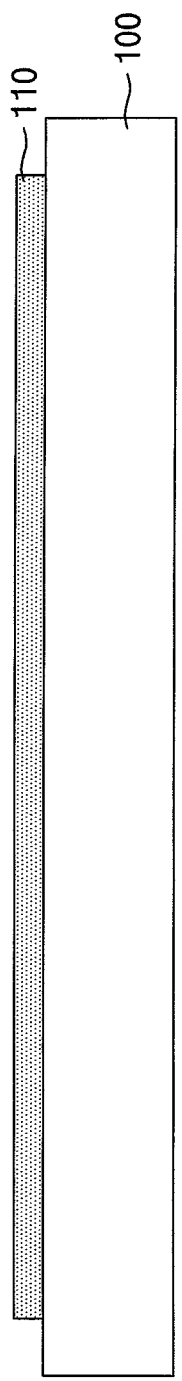
FIGS. 5 to 7 are schematic cross-sectional views illustrating the formation of a flexible substrate and a display element part according to an embodiment.

Referring to FIG. 5, an edge of the barrier adhesion layer 110 is removed to partially expose an upper surface of the carrier substrate 100.

For example, a plasma torch may be used, or an alkali material such as tetramethylammonium hydroxide ("TMAH") may be applied, in order to pattern the barrier adhesion layer 110.

The edge of the barrier adhesion layer 110 is removed to partially expose an upper surface of the carrier substrate 100 so that an edge of the flexible substrate 200, which will be formed on the barrier adhesion layer 110, may contact the exposed upper surface of the carrier substrate 100. Thus, if the barrier adhesion layer 110 has a shape already partially exposing the upper surface of the carrier substrate 100, the step of removing the edge of the barrier adhesion layer 110 may be omitted.

Thereafter, the barrier adhesion layer 110 may be baked. Through baking, a solvent remaining in the barrier adhesion layer 110 may be removed, and a density of the barrier adhesion layer 110 may increase. In an embodiment, for example, a temperature for the baking process may be about 300° C. to about 500° C.

In an embodiment, for example, an adhesion force of the barrier adhesion layer 110 may be about 1 Gram-force/inch (gf/in) to about 5 gf/in.

Figure 6:
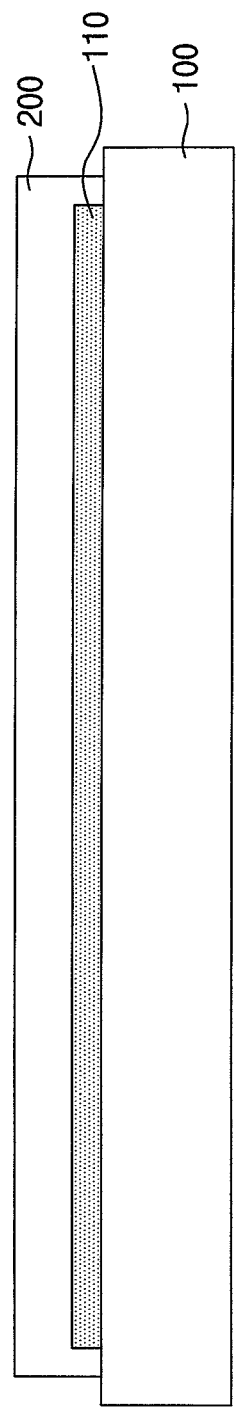

Referring to FIG. 6, the flexible substrate 200 is formed on the barrier adhesion layer 110. For example, a composition including a polymer or a monomer capable of forming a polymer may be coated on the barrier adhesion layer 110, and may be dried or cured to form the flexible substrate 200.

In an embodiment, for example, the flexible substrate 200 may include at least one selected from the group consisting of polyester, polyvinyl, polycarbonate, polyethylene, polypropylene, polyacetate, polyimide, polyethersulphone, polyacrylate, polyethylenenaphthelate, and polyethyleneterephehalate.

In an embodiment, the flexible substrate 200 may include polyimide, which has superior mechanical characteristics and heat resistance.

In an embodiment, an edge of the flexible substrate 200 contacts the carrier substrate 100. Thus, a side surface of the barrier adhesion layer 110 may be covered by the flexible substrate 200. If the flexible substrate 200 is entirely spaced apart from the carrier substrate 100 by the barrier adhesion layer 110 without contacting between edges of the carrier substrate 100 and flexible substrate 200 in the process of forming the display element part, the flexible substrate 200 may be separated from the carrier substrate 100, or dislocation between the flexible substrate 200 and the carrier substrate 100 may be caused, due to the low adhesive force of the barrier adhesion layer 110 before a cutting process which will be explained later.

Figure 7:
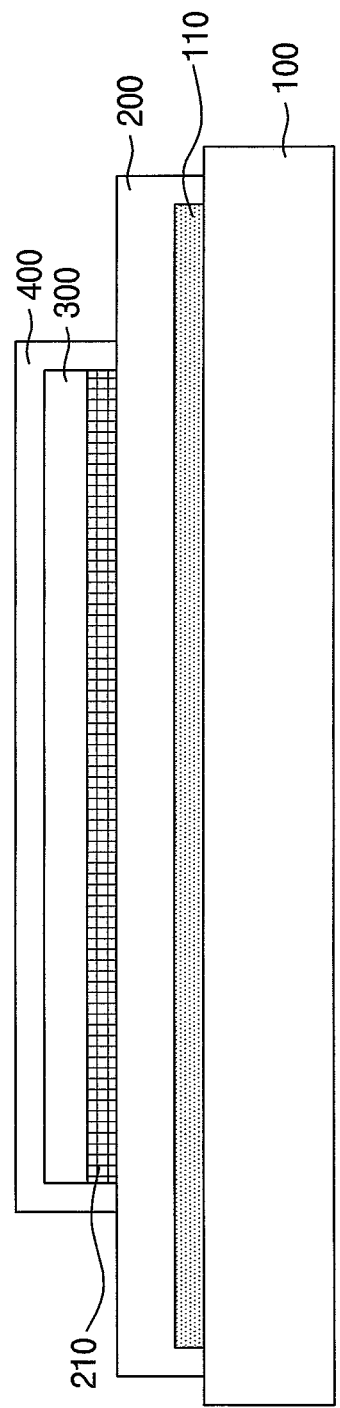

Referring to FIG. 7, a first barrier layer 210 is formed on the flexible substrate 200. A display element part 300 and a protective film 400 covering the display element part 300 are formed on the first barrier layer 210.

The first barrier layer 210 may prevent external impurities from penetrating into the display element part 300.

For example, the first barrier layer 210 may include an inorganic material. In an embodiment, for example, the inorganic material may include silicon oxide, silicon nitride, silicon oxynitride, silicon carbide, silicon oxycarbide, or a combination thereof. The first barrier layer 210 may have a single-layer structure or a multi-layer structure including layers which may include different materials.

In an embodiment, the first barrier layer 210 may include a multi-layer structure of a silicon oxide ($SiO_2$) layer, a silicon nitride (SiN) layer, and a silicon oxynitride (SiON) layer. In an embodiment, for example, a thickness of the silicon oxide layer may be about 2,000 angstroms (Å) to about 10,000 Å, the thickness of a silicon nitride layer may be about 100 Å to about 1,000 Å, and the thickness of a silicon oxynitride layer may be bout 2,000 Å to about 10,000 Å. The multi-layer structure may effectively prevent or inhibit penetration of humidity or particles.

For example, the first barrier layer 210 may be formed through chemical vaporization deposition (CVD), plasma-enhanced chemical vaporization deposition (PECVD), physical deposition, atomic layer deposition (ALD), or the like.

The first barrier layer 210 is shown to partially cover a surface of the flexible substrate 200 in FIG. 7, however, the invention is not limited thereto. In another embodiment, for example, the first barrier layer 210 may be formed entirely on the upper surface of the flexible substrate 200, or may extend to contact the carrier substrate 100.

Figure 8:
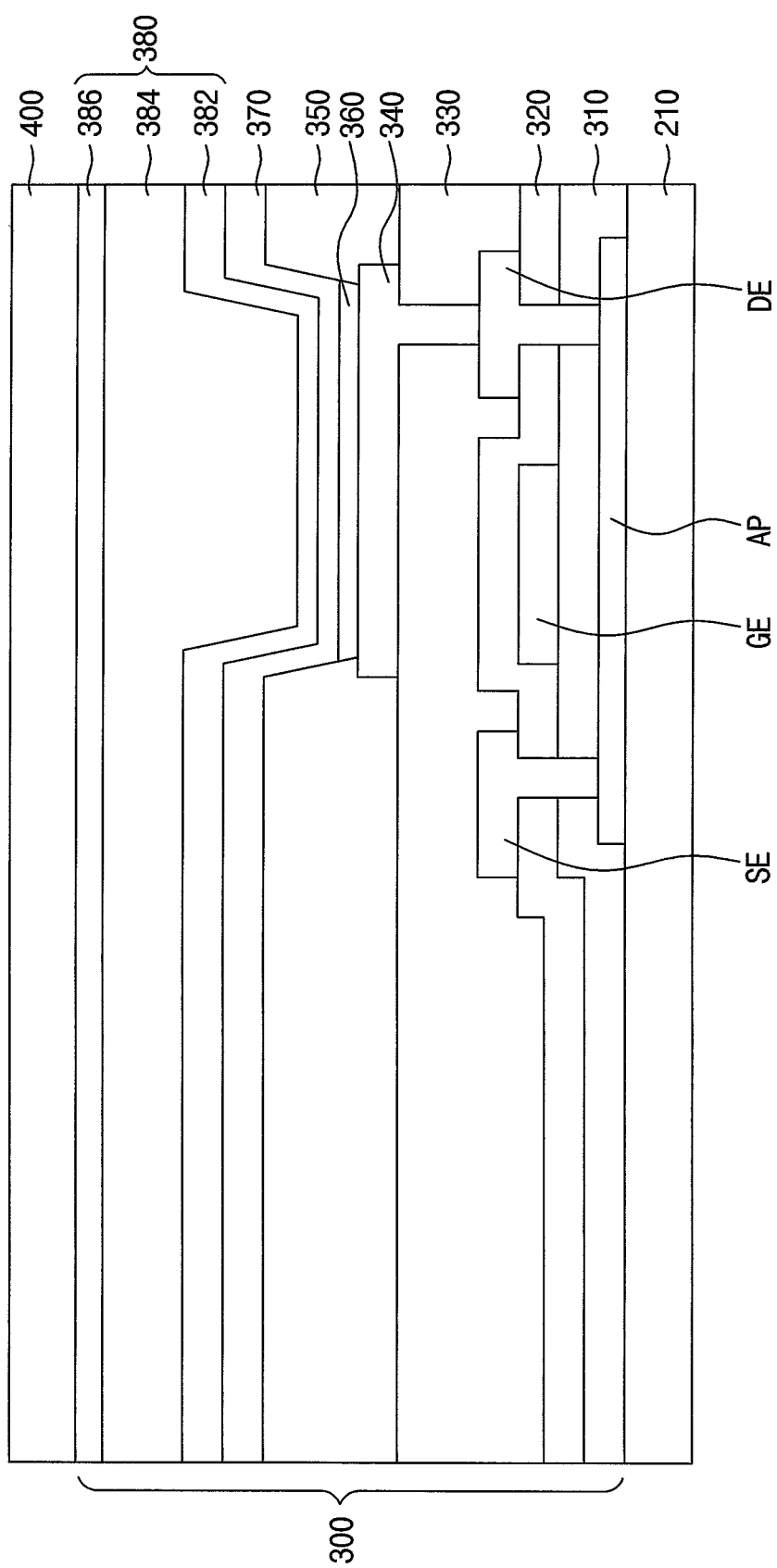
FIG. 8 is a schematic cross-sectional view illustrating a display element part according to an embodiment.

FIG. 8 is an enlarged schematic cross-sectional view illustrating an embodiment of a display element part of a flexible display device according to the invention.

Referring to FIG. 8, the display element part 300 may include a pixel circuit, an organic light-emitting diode electrically connected to the pixel circuit, and a thin film encapsulation layer covering the organic light-emitting diode.

The pixel circuit may include an active pattern AP, a gate electrode GE overlapping the active pattern AP in a plan view, a source electrode SE electrically connected to the active pattern AP, and a drain electrode DE spaced apart from the source electrode SE and electrically connected to the active pattern AP.

The active pattern AP may be disposed on the first barrier layer 210. The active pattern AP may overlap the gate electrode GE.

In an embodiment, for example, the active pattern AP may include a semiconductor material such as amorphous silicon, polycrystalline silicon (polysilicon), oxide semiconductor, or the like. For example, when the active pattern AP includes polysilicon, at least a portion of the active pattern AP may be doped with impurities such as n-type impurities or p-type impurities.

A first insulation layer 310 may be disposed on the active pattern AP. In an exemplary embodiment, for example, the first insulation layer 310 may include silicon oxide, silicon nitride, silicon oxynitride, silicon carbide, silicon oxycarbide or a combination thereof. Furthermore, the first insulation layer 310 may include an insulating metal oxide such as aluminum oxide, tantalum oxide, hafnium oxide, zirconium oxide, titanium oxide or the like. For example, the first insulation layer 310 may have a single-layer structure or a multiple-layer structure including silicon nitride and/or silicon oxide.

The gate electrode GE may be disposed on the first insulation layer 310. In an embodiment, for example, the gate electrode GE may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layer structure or a multiple-layer structure including different metal layers.

A second insulation layer 320 may be disposed on the gate electrode GE and the first insulation layer 310. In an embodiment, for example, the second insulation layer 320 may include silicon oxide, silicon nitride, silicon oxynitride, silicon carbide, silicon oxycarbide, or a combination thereof. Furthermore, the second insulation layer 320 may include an insulating metal oxide such as aluminum oxide, tantalum oxide, hafnium oxide, zirconium oxide, titanium oxide, or the like.

A data metal pattern including the source electrode SE and the drain electrode DE may be disposed on the second insulation layer 320. The source electrode SE and the drain electrode DE may pass through the first insulation layer 310 and the second insulation layer 320 to contact the active pattern AP, respectively. In an embodiment, for example, the source electrode SE and the drain electrode DE may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layer structure or a multiple-layer structure including different metal layers.

A third insulation layer 330 may be disposed on the data metal pattern and the second insulation layer 320. For example, the third insulation layer 330 may include an inorganic insulation material, an organic insulation material, or a combination thereof. In an embodiment, for example, the organic insulation material may include polyimide, polyamide, acrylic resin, phenol resin, benzocyclobutene (BCB), or the like.

A first electrode 340 of the organic light-emitting diode may be disposed on the third insulation layer 330. In an embodiment, the first electrode 340 may function as an anode. For example, the first electrode 340 may be formed as a transmitting electrode or a reflecting electrode according to an emission type of the display device. When the first electrode 340 is a transmitting electrode, the first electrode 340 may include indium tin oxide, indium zinc oxide, zinc tin oxide, indium oxide, zinc oxide, tin oxide, or the like, for example. When the first electrode 340 is a reflecting electrode, the first electrode 340 may include, for example, gold (Au), silver (Ag), aluminum (Al), copper (Cu), nickel (Ni), platinum (Pt), magnesium (Mg), chromium (Cr), tungsten (W), molybdenum (Mo), titanium (Ti), or a combination thereof, and may have a stacked structure further including the material that may be used for the transmitting electrode.

A pixel-defining layer 350 may be disposed on the third insulation layer 330. The pixel-defining layer 350 may define an opening that exposes at least a portion of the first electrode 340. For example, the pixel-defining layer 350 may include an organic insulation material. For example, the pixel-defining layer 350 and the third insulation layer 330 may be formed by coating a photoresist composition including an organic insulation material and patterning a coating layer using exposure-development processes.

An organic light-emitting layer 360 may be disposed on the first electrode 340. A common layer 370 may be disposed on the organic light-emitting layer 360. The common layer 370 may include at least one layer extending continuously across pixels in a display area.

In an embodiment, the organic light-emitting layer 360 may have a patterned shape disposed in an opening defined by the pixel-defining layer 350. However, the invention is not limited thereto, and the organic light-emitting layer 360 may continuously extend across pixels in a display area, like the common layer 370.

In an embodiment, for example, the organic light-emitting layer 360 may include at least one of a hole injection layer (HIL), a hole transporting layer (HTL), a light-emitting layer, an electron transporting layer (ETL) and an electron injection layer (EIL), and at least a portion of the organic light-emitting layer 360 may continuously extend across pixels in a display area, like the common layer 370. For example, the organic light-emitting layer 360 may include a low molecular weight organic compound or a high molecular weight organic compound.

In an embodiment, the organic light-emitting layer 360 may emit a red light, a green light, or a blue light. In another embodiment, the organic light-emitting layer 360 may emit a white light. The organic light-emitting layer 360 emitting a white light may have a multiple-layer structure including a red-emitting layer, a green-emitting layer, and a blue-emitting layer, or a single-layer structure including a mixture of a red-emitting material, a green-emitting material, and a blue-emitting material.

For example, the common layer 370 may include at least a second electrode of the organic light-emitting diode, and may further include a capping layer and/or a blocking layer on the second electrode.

In an embodiment, the second electrode may function as a cathode. For example, the second electrode may be formed as a transmitting electrode or a reflecting electrode according to an emission type of the display device. For example, in the case that the second electrode is a transmitting electrode, the second electrode may include lithium (Li), calcium (Ca), lithium fluoride (LiF), aluminum (Al), magnesium (Mg), or a combination thereof, and the display device may further include a sub electrode or a bus electrode line which includes indium tin oxide, indium zinc oxide, zinc tin oxide, indium oxide, zinc oxide, tin oxide, or the like.

The capping layer may be disposed on the second electrode. The capping layer may protect the organic light-emitting diode and may promote the light generated by the organic light-emitting diode to exit outwardly. For example, the capping layer may include an inorganic material or an organic material.

The blocking layer may be disposed on the capping layer. The blocking layer may prevent damage to the organic light-emitting diode by plasma or the like from later processes. For example, the blocking layer may include lithium fluoride, magnesium fluoride, calcium fluoride, or the like.

The thin film encapsulation layer 380 may be disposed on the common layer 370. The thin film encapsulation layer 380 may have a stacked structure of an inorganic layer and an organic layer. For example, the thin film encapsulation layer 380 may include a first inorganic layer 382, a second inorganic layer 386, and an organic layer 384 disposed between the first and second inorganic layers 382 and 386.

For example, the organic layer 384 may include a cured resin such as polyacrylate or the like. For example, the cured resin may be formed from cross-linking reaction of monomers.

In an embodiment, for example, the first and second inorganic layers 382 and 386 may include an inorganic material such as silicon oxide, silicon nitride, silicon carbide, aluminum oxide, tantalum oxide, hafnium oxide, zirconium oxide, titanium oxide, or the like, and may be formed by chemical vaporization deposition.

The organic layer 384 may be formed on the first inorganic layer 382. For example, a monomer composition may be provided on an upper surface of the first inorganic layer 382 to form the organic layer 384.

The monomer composition may include a curable monomer. For example, the curable monomer may contain at least one curable functional group. In an embodiment, for example, the curable functional group may include a vinyl group, a (meth)acrylate group, an epoxy group, or the like.

In an embodiment, for example, the curable monomer may include ethyleneglycol di(meth)acrylate, hexanediol di(meth)acrylate, heptanediol di(meth)acrylate, octanediol di(meth)acrylate, nonanediol di(meth)acrylate, decanediol di(meth)acrylate, triethylpropane tri(meth)acrylate, pentaerythritol tri(meth)acrylate, pentaerythritol tetra(meth)acrylate, dipentaerythritol tri(meth)acrylate, dipentaerythritol tetra(meth)acrylate, dipentaerythritol penta(meth)acrylate, dipentaerythritol hexa(meth)acrylate, or the like.

The monomer composition may further include an initiator such as a photo initiator or the like.

The monomer composition may be provided on the first inorganic layer 382 through ink-jet printing, screen printing, or the like, and may be cured to form the cured resin.

The embodiments are not limited to the above-explained configuration of the thin film encapsulation layer 380. In another embodiment, for example, the thin film encapsulation layer 380 may include at least two organic layers or at least three inorganic layers.

The protective film 400 may cover an upper surface of the thin film encapsulation layer 380. For example, the protective film 400 may include a polymer film or the like.

Hereinafter, a process of separating the flexible substrate 200 from the carrier substrate 100 will be explained with reference to FIGS. 9 to 13.

Figure 9:
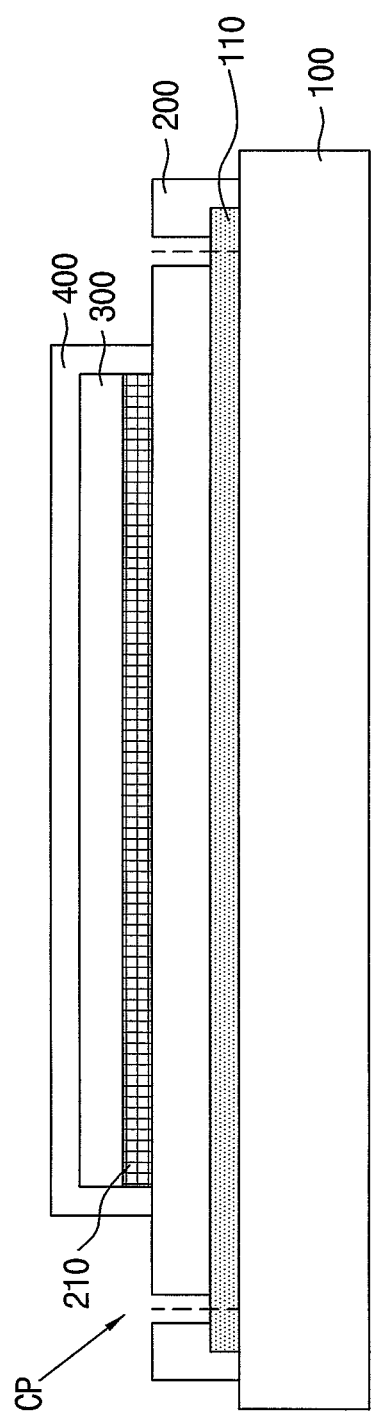
FIGS. 9 to 13 are schematic cross-sectional views illustrating separating a flexible substrate from a carrier substrate according to an embodiment.

Referring to FIG. 9, a cutting portion CP is defined at an edge of the flexible substrate 200. For example, the cutting portion CP may be defined in an area where the flexible substrate 200 and the barrier adhesion layer 110 overlap each other in the plan view. In an embodiment, a cutting line of the cutting portion CP may be disposed between an outer boundary of the barrier adhesion layer 110 and an outer boundary of the display element part 300, in the plan view. For example, the flexible substrate 200 may be cut along the cutting line surrounding the display element part 300 with a laser, a knife, or the like.

In an embodiment, an area where the carrier substrate 100 directly contacts the flexible substrate 200 and an area where the carrier substrate 100 overlaps the display element part 300 in the plan view may be preferably separated from each other by the cutting portion CP. When the area where the carrier substrate 100 directly contacts the flexible substrate 200 and the area where the carrier substrate 100 overlaps the display element part 300 are separated from each other, the process of separating the carrier substrate 100 from flexible substrate 200 may be easily performed without interference by the strong bond between the carrier substrate 100 and flexible substrate 200.

Figure 10:
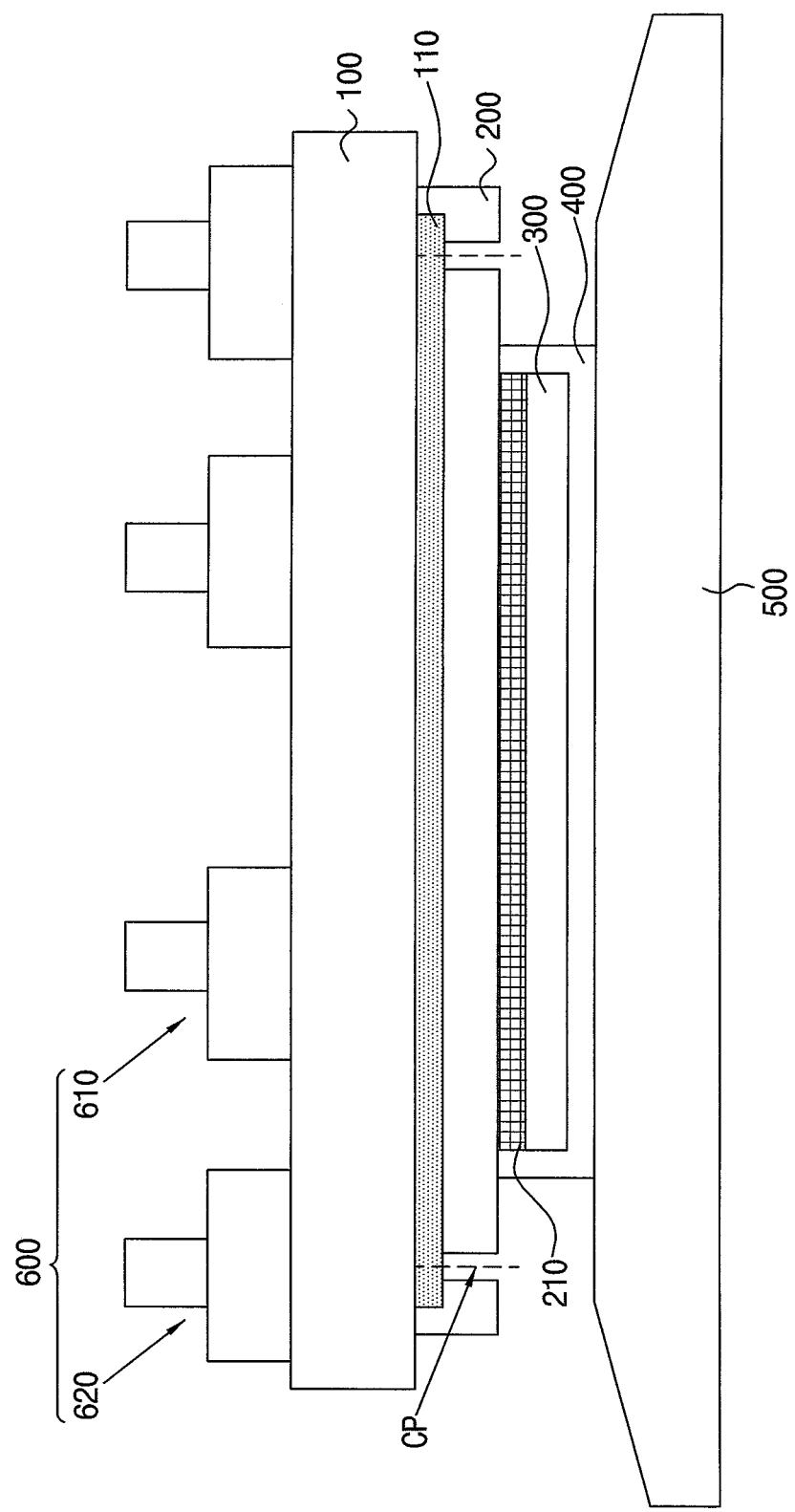

Referring to FIG. 10, the protective film 400 is combined with a fixing stage 500, and the carrier substrate 100 is combined with a fixing member 600.

For example, vacuum or negative pressure may be provided to the fixing stage 500 and the fixing member 600 so that the fixing stage 500 and the fixing member 600 may be combined with the protective film 400 and the carrier substrate 100, respectively.

The fixing member 600 may include fixing pads. For example, the fixing member 600 may include a first fixing member 610 combined with an area overlapping the display element part 300, and a second fixing member 620 combined with an area overlapping the cutting portion CP in the plan view.

Figure 11:
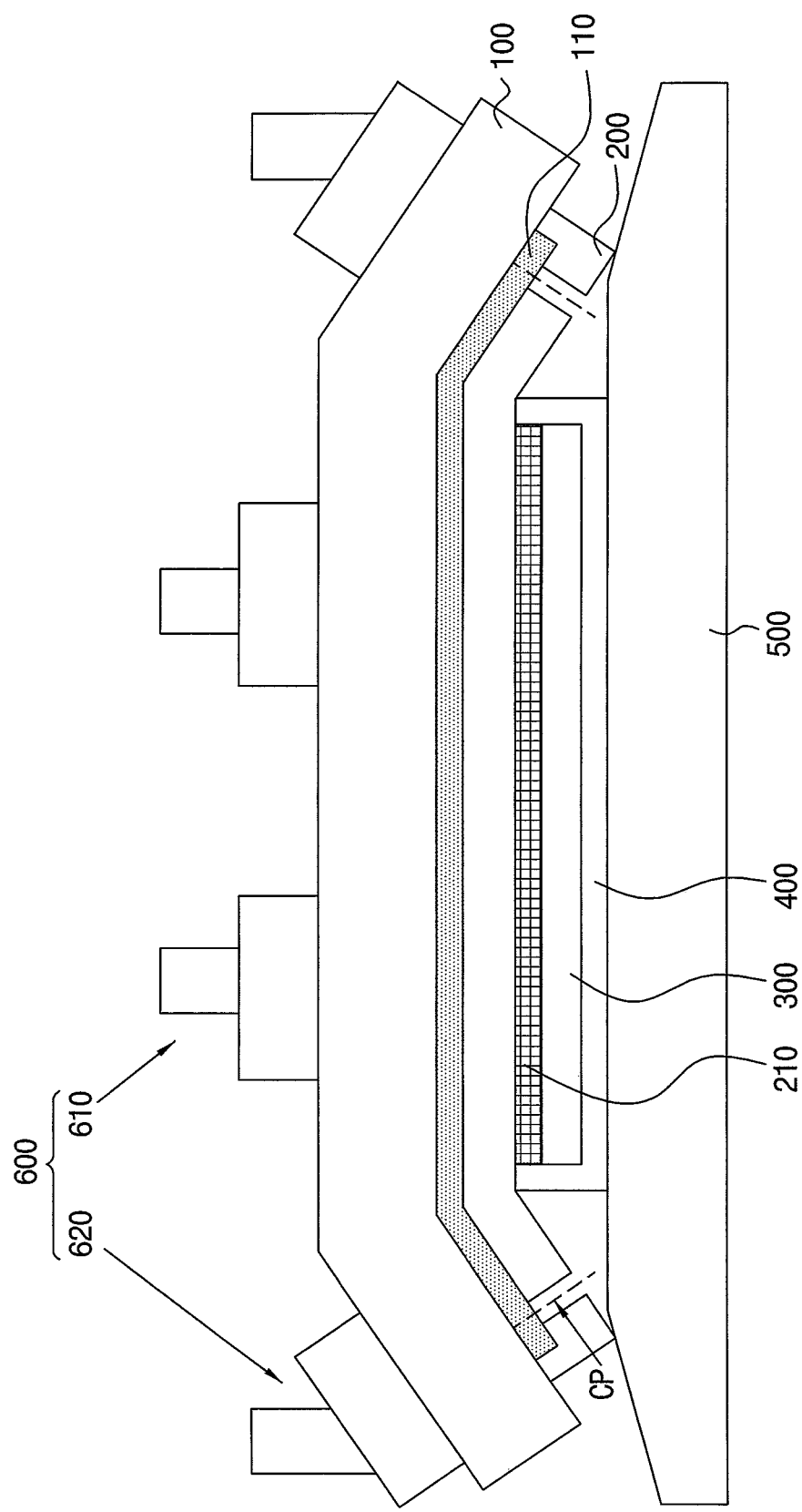

Referring to FIG. 11, the second fixing member 620 combined with the area overlapping the cutting portion CP may move downwardly and toward the fixing stage 500. Thus, a region near an edge of the flexible substrate 200 may bend so that the edge of the flexible substrate 200 may contact the fixing stage 500. Since the fixing stage 500 provides vacuum or negative pressure, the edge of the flexible substrate 200 may be adsorbed onto and combined with the fixing stage 500.

Figure 12:
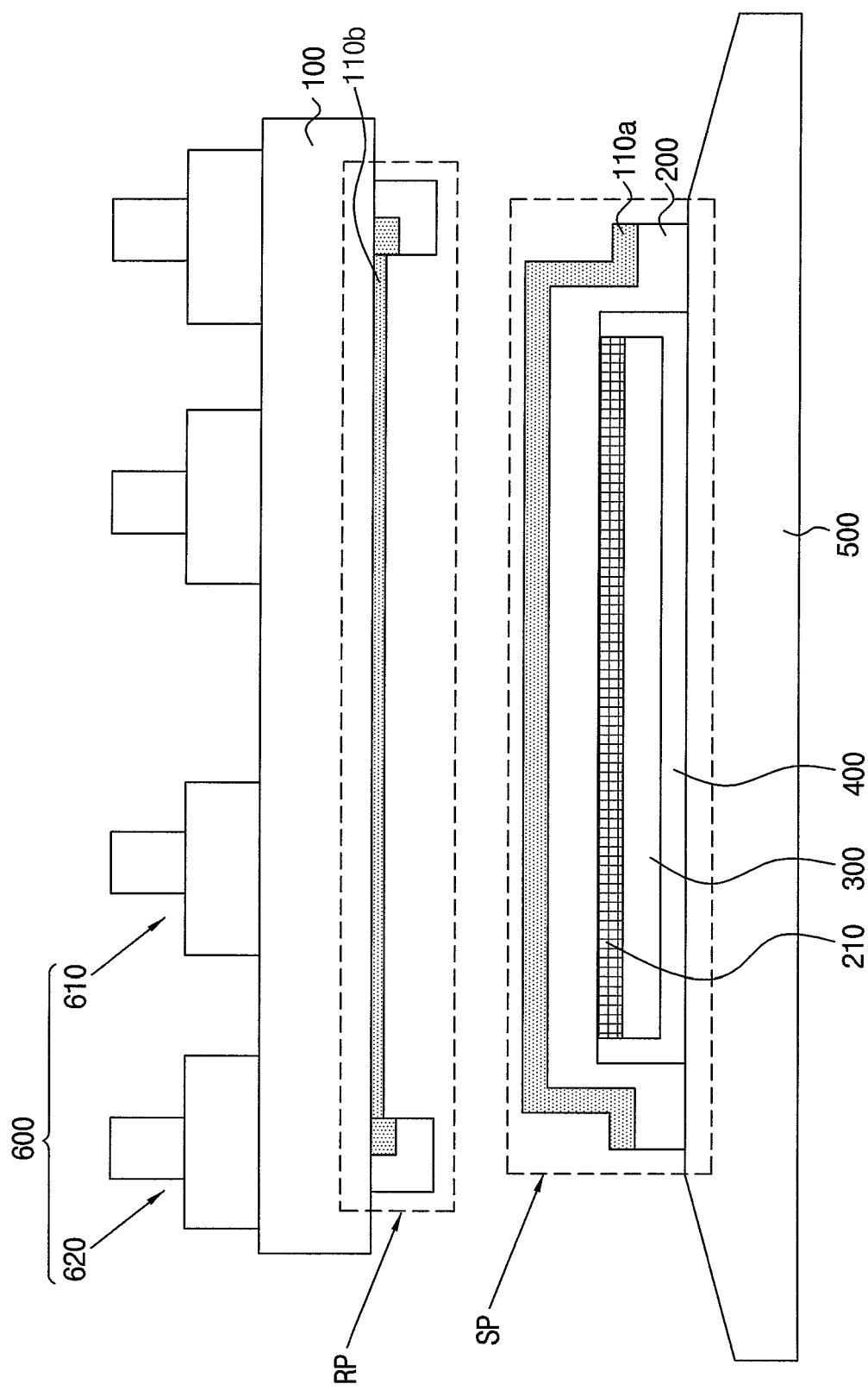

Referring to FIG. 12, the fixing member 600 combined with the carrier substrate 100 may move upwardly to separate the flexible substrate 200 from the carrier substrate 100.

As explained in the above, the barrier adhesion layer 110 includes a plurality of graphene oxide layers, which are electric-charged with opposite polarities and weakly bonded to each other by electrostatic force. Thus, if external forces are applied to the flexible substrate 200 and the carrier substrate 100 in opposite, outward directions, respectively, the flexible substrate 200 and the carrier substrate 100 may be easily separated from each other without an additional process such as radiating a laser.

The portion of the flexible substrate 200 where the carrier substrate 100 directly contacts may be separated from a separated portion SP combined with the fixing stage 500 when the external forces are applied. A strong bond is formed at an interface between the carrier substrate 100 and the portion of the flexible substrate 200. Thus, the flexible substrate 200 may be divided into the separated portion SP and a remaining portion RP (i.e., the portion of the flexible substrate 200 where the carrier substrate 100 directly contacts). The remaining portion RP may be combined with the carrier substrate 100.

The barrier adhesion layer 110 includes the graphene oxide layers electric-charged with opposite polarities and alternately stacked. Thus, when a physical external force is applied to the barrier adhesion layer 110, an interlayer combination by electrostatic force is broken thereby causing interlayer separation. Thus, a first portion 110a of the barrier adhesion layer 110 may adhere to the flexible substrate 200, and a second portion 110b of the barrier adhesion layer 110 may adhere to the carrier substrate 100 after the flexible substrate 200 is separated from the carrier substrate 100.

In an embodiment, before the flexible substrate 200 is separated from the carrier substrate 100 by the external forces applied thereto in opposite, outward directions, the carrier substrate 100 and the flexible substrate 200 are bended so that the flexible substrate 200 may contact the fixing stage 500 directly. Thus, the flexible substrate 200 may be adsorbed onto and combined with the fixing stage 500, and the external force may be directly applied to the flexible substrate 200.

Figure 13:
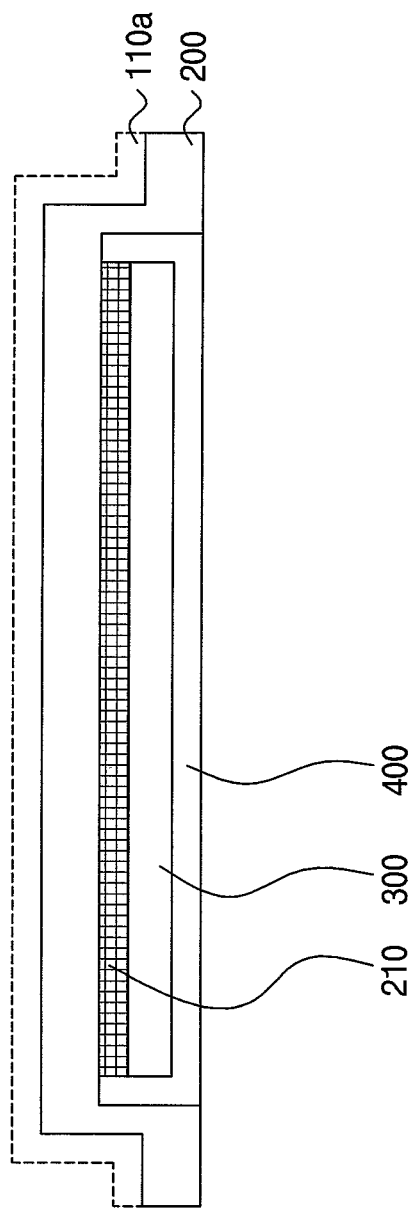

Referring to FIG. 13, the portion 110a of the barrier adhesion layer remaining on the flexible substrate 200 is removed.

For example, the remaining portion 110a of the barrier adhesion layer may be removed by a wet method using TMAH or a dry method using plasma or the like.

An additional barrier layer may be formed on the surface of the flexible substrate 200 from which the remaining portion 110a of the barrier adhesion layer 110 is removed after the removal.

According to embodiments, a barrier adhesion layer is disposed between a carrier substrate and a flexible substrate. Thus, a chemical bond between the carrier substrate and the flexible substrate may be prevented, and the carrier substrate may be mechanically separated from the flexible substrate without a laser-radiation process or the like.

Furthermore, uniformity of a barrier adhesion layer may be improved, and a surface roughness of the barrier adhesion layer may be reduced. Thus, a required thickness of the barrier adhesion layer may be reduced, and a wrinkle of the barrier adhesion layer may be prevented, and undesired bonding of a carrier substrate and a flexible substrate may be prevented.

Hereinafter, effects of the embodiments will be explained with reference to particular examples and experiments.

Experiment 1—Evaluation for Coating Ability of Positively Electric-Charged Graphene Oxide An aqueous solution including 0.4 wt % of a graphene oxide, which was obtained by the Hummer method and having a thickness of about 0.85 nm, a maximum diameter of about 20 μm and an oxygen content of about 40 wt %, was prepared. A positively electric-charged graphene oxide was obtained from the aqueous solution according to Table 1. The solution including the positively electric-charged graphene oxide was diluted to prepare a coating composition such that a content of the positively electric-charged graphene oxide was about 0.004 wt % in the coating composition. Properties of the coating composition was measured and represented by the following Table 2.

oxide monolayer was measured. Thereafter, an aqueous solution including about 0.004 wt % of a negatively electric-charged graphene oxide, which had a thickness of about 0.85 nm, a maximum diameter of about 20 μm and an oxygen content of about 40 wt %, and having a conductivity of about 0.009 mS/cm and a zeta potential of about +30 mV was used to form stacked structures (1.0, 1.5, 2.0 dyads) including the positively electric-charged graphene oxide and the negatively electric-charged graphene oxide, which were interlayer-bonded to each other by electrostatic force. Transmittance of the stacked structures was measured. The transmittance was measured on 10×10 cm glass substrate by COH-400 of NIPPON DENSHOKU™ (colormeter for petroleum products) and represented in the following Table 3.

The graphene oxide monolayer and the stacked structures were dried and heated at a temperature equal to or less than about 500° C.

TABLE 1

|  | Reaction temperature (° C.) | Reaction time (h) | Amine | Ea of amine (kcal/mol) | Amine content (wt %) | note |
|---|---|---|---|---|---|---|
| Comparative Example 1 | 80 | 12 | 2-methoxy-5-methylaniline | 15.1 | 0.4 |  |
| Comparative Example 2 | 50 | 24 | 2-methoxy-5-methylaniline | 15.1 | 0.4 |  |
| Comparative Example 3 | 50 | 24 | DMPD | 7.6 | 0.4 |  |
| Comparative Example 4 | 50 | 3 | DMPD | 7.6 | 0.4 |  |
| Comparative Example 5 | 50 | 6 | Ionic liquid | 8.8 | 0.4 |  |
| Comparative Example 6 | 50 | 6 | 2-methoxy-5-methylaniline | 15.1 | 0.4 |  |
| Example 1 | 50 | 12 | DMPD | 7.6 | 0.4 |  |
| Example 2 | 50 | 12 | DMPD | 7.6 | 0.2 |  |
| Example 3 | 50 | 12 | DMPD | 7.6 | 4.0 |  |
| Example 4 | 50 | 6 | DMPD | 7.6 | 0.4 |  |
| Example 5 | 50 | 3 | DMPD | 7.6 | 0.4 | polyetherimide 0.2 wt % added |

TABLE 2

|  | Thickness of functionalized graphene oxide (nm) | Solution conductivity (mS/cm) | Zeta potential (mV) |
|---|---|---|---|
| Comparative Example 1 | 5.3 | 0.11 | +38 |
| Comparative Example 2 | 3.3 | 0.04 | +10 |
| Comparative Example 3 | 2.4 | 0.06 | +30 |
| Comparative Example 4 | 0.85 | 0.009 | +10 |
| Comparative Example 5 | 1.31 | 0.05 | +20 |
| Comparative Example 6 | 1.31 | 0.08 | +5 |
| Example 1 | 1.31 | 0.05 | +35 |
| Example 2 | 1.31 | 0.05 | +34 |
| Example 3 | 1.31 | 0.01 | +36 |
| Example 4 | 1.31 | 0.009 | +30 |
| Example 5 | 0.85 | 0.009 | +45 |

TABLE 3

|  | 0.5 dyads | 1.0 dyads | 1.5 dyads | 2.0 dyads | Coating quality |
|---|---|---|---|---|---|
| Comparative Example 1 | 99.9 | 99.7 | 98.8 | 99.1 | uncoated |
| Comparative Example 2 | 98.9 | 93.1 | 86.3 | 81.1 | Non-uniform |
| Comparative Example 3 | 98.2 | 95.6 | 94.1 | 86.2 | Non-uniform |
| Comparative Example 4 | 98.0 | 96.1 | 94.9 | 91.3 | Non-uniform |
| Comparative Example 5 | 99.1 | 95.8 | 94.1 | 90.3 | Non-uniform |
| Comparative Example 6 | 99.6 | 97.7 | 97.3 | 95.0 | Non-uniform |
| Example 1 | 97.2 | 94.0 | 91.5 | 88.2 |  |
| Example 2 | 97.3 | 94.4 | 91.2 | 88.6 |  |
| Example 3 | 97.0 | 94.0 | 90.5 | 88.1 |  |
| Example 4 | 97.1 | 94.2 | 90.9 | 88.3 |  |
| Example 5 | 96.9 | 94.0 | 91.1 | 87.9 |  |

The coating compositions of Table 2 were coated on a substrate by an electrostatic spray to form a graphene oxide monolayer (0.5 dyads), and transmittance of the graphene Referring to Table 3, when the coating composition of Comparative Example 1 was used, the transmittance was not reduced even if the amount of coating was increased. Thus, it can be noted that the coating composition of Comparative Example 1 failed to form a stacked structure. When the coating compositions of Comparative Examples 2-6 were used, the transmittance was irregularly reduced. Thus, it can be noted that the coating compositions of Comparative Examples 2 to 6 formed non-uniformly stacked structures. When the coating compositions of Examples 1-5 were used, the transmittance was linearly reduced depending on the number of coating. Thus, it can be noted that the coating compositions of Examples 1-5 formed uniformly stacked structures. Furthermore, even if the graphene oxide of Example 5 was functionalized less because of less reaction time, the coating composition formed uniformly stacked structure since a zeta potential of the coating composition was increased by the water-soluble polymer.

Experiment 2—Evaluation for Coating Ability of Positively Electric-Charged Graphene Oxide Aqueous coating compositions including about 0.004 wt % of a negatively electric-charged graphene oxide and represented by the following Table 4 were prepared by adjusting conditions of oxidation and exfoliation in the Hummer method.

TABLE 4

| | Oxygen content (wt %) | Thickness of graphene oxide (nm) | Solution conductivity (mS/cm) | Zeta potential (mV) |
|---|---|---|---|---|
| Comparative Example 7 | 35 | 4.2 | 0.08 | −40 |
| Comparative Example 8 | 40 | 2.2 | 0.06 | −42 |
| Comparative Example 9 | 40 | 1.4 | 0.05 | −45 |
| Comparative Example 10 | 40 | 0.85 | 0.01 | −50 |
| Example 6 | 50 | 0.85 | 0.01 | −46 |

The coating compositions of Table 4 were coated on a substrate by an electrostatic spray to form a graphene oxide monolayer (0.5 dyads), and transmittance of the graphene oxide monolayer was measured. Thereafter, the coating composition of Example 2 was used to form stacked structures (1.0, 1.5, 2.0 dyads) including the positively electric-charged graphene oxide and the negatively electric-charged graphene oxide, which were interlayer-bonded to each other by electrostatic force.

Transmittance of the stacked structures was measured and represented in the following Table 5.

The graphene oxide monolayer and the stacked structures were dried and heated at a temperature equal to or less than about 500° C.

TABLE 5

| | 0.5 dyads | 1.0 dyads | 1.5 dyads | 2.0 dyads | Coating quality |
|---|---|---|---|---|---|
| Comparative Example 7 | 99.8 | 99.8 | 99.4 | 99.9 | uncoated |
| Comparative Example 8 | 99.6 | 98.9 | 99.1 | 98.3 | uncoated |
| Comparative Example 9 | 99.2 | 98.3 | 94.1 | 91.7 | Non-uniform |
| Comparative Example 10 | 99.9 | 99.9 | 99.9 | 99.9 | decomposed by heat |
| Example 6 | 96.9 | 94.3 | 91.5 | 88.6 | |

Referring to Table 5, when the coating compositions of Comparative Examples 7 and 8 were used, the transmittance was not reduced even if the amount of coating was increased. Thus, it can be noted that the coating compositions of Comparative Examples 7 and 8 failed to form a stacked structure. When the coating composition of Comparative Example 9 was used, the transmittance was irregularly reduced. Thus, it can be noted that the coating composition of Comparative Example 9 formed a non-uniformly stacked structure. When the coating composition of Comparative Example 10 was used, the transmittance was not reduced even if the number of coating was increased since the graphene oxide was decomposed in the heating process.

When the coating composition of Examples 6 was used, the transmittance was linearly reduced depending on the number of coating. Thus, it can be noted that the coating composition of Examples 6 formed a uniformly stacked structure.

The embodiments may be used for forming various stacked structures bonded between inner layers by electrostatic force. For example, embodiments may be applied to fabrication of a flexible display device for a computer, a notebook computer, a tablet computer, a smart phone, a mobile phone, a navigator, a PDA, an audio player, an automobile, a home appliance, a wearable device, or the like.

The foregoing is illustrative of the embodiments and is not to be construed as limiting thereof. Although the embodiments have been described, those skilled in the art will readily appreciate that many modifications are possible in the embodiments without materially departing from the novel teachings and aspects of the invention. Accordingly, all such modifications are intended to be included within the scope of the invention. Therefore, it is to be understood that the foregoing is illustrative of various embodiments and is not to be construed as limited to the specific embodiments disclosed, and that modifications to the disclosed embodiments, as well as other embodiments, are intended to be included within the scope of the invention, as set forth in the following claims and equivalents thereof.

What is claimed is:

1. A coating composition comprising:
   a graphene oxide;
   a water-soluble polymer; and
   a solvent, wherein
   the water-soluble polymer includes at least one selected from the group consisting of PSS (poly(styrene sulfonate)), PEI (polyetherimide), PDDA (poly(diallyldimethylammonium chloride)), PMA (poly(methacrylic acid)), PVS (poly(vinyl sulfate)), poly(amic acid), and PAH (poly(allylamine hydrochloride)),
   a weight ratio of the water-soluble polymer to the graphene oxide is 0.01 to 1,
   at least one of a carboxyl group and an epoxide group of the graphene oxide is functionalized by an amine,
   the amine has an activation energy to an epoxide group of the graphene oxide of −3 kcal/mol to 8 kcal/mol,
   a zeta potential of the coating composition is +30 mV to +60 mV, and
   a solution conductivity of the coating composition is 0.001 mS/cm to 0.05 mS/cm.

2. The coating composition of claim 1, wherein the coating composition has a graphene oxide content of 0.00001 wt % to 4 wt %.

3. The coating composition of claim 1, wherein the amine is represented by Formula 1:

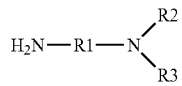
<Formula 1> wherein in Formula 1,
R1 is a straight or branched alkylene group of 3 to 10 carbon atoms, an aromatic ring group, an aliphatic ring group, or a combination thereof, and
R2 and R3 are independently hydrogen or a methyl group.

4. The coating composition of claim 3, wherein the amine includes at least one selected from the group consisting of N,N-dimethyl-p-phenylene diamine, p-phenylene diamine, 3-dimethylamino-1-propyl amine, and 2,2-(1,2-phenylene)bis(1H-benzo[d]imidazol-5-amine).

5. The coating composition of claim 1, wherein the graphene oxide has a thickness of 0.5 nm to 2 nm.

6. The coating composition of claim 1, wherein the solvent includes at least one selected from the group consisting of heptane, hexane, ethanol, methanol, butanol, propanol, methylene chloride, trichloroethylene, ethyl acetate, acetone, methylethylketone, diethylamine, di-isopropylamine, isopropylamine, and water.

7. A method for forming a stacked structure, the method comprising:
A forming a first coating layer by providing the coating composition of claim 1, wherein the graphene oxide is positively electric-charged, on a substrate; and
forming a second coating layer by providing a second coating composition including a negatively electric-charged graphene oxide on the substrate, the second coating layer being interlayer-bonded to the first coating layer by electrostatic force.

8. The method of claim 7, wherein the amine includes at least one selected from the group consisting of N,N-dimethyl-p-phenylene diamine, p-phenylene diamine, 3-dimethylamino-1-propyl amine, and 2,2-(1,2-phenylene)bis(1H-benzo[d]imidazol-5-amine).

9. The method of claim 7, wherein the positively electric-charged graphene oxide has a thickness of about 0.5 nm to about 2 nm.

10. The method of claim 7, wherein:
a zeta potential of the second coating composition is about −30 mV to about −60 mV, and
a solution conductivity of the second coating composition is about 0.001 mS/cm to about 0.05 mS/cm.

11. The method of claim 10, wherein the negatively electric-charged graphene oxide has a thickness of about 0.5 nm to about 1 nm.

12. The method of claim 7, wherein the negatively electric-charged graphene oxide has an oxygen content of about 35 wt % to about 48 wt %.

13. A method for manufacturing a display device, the method comprising:
forming a first graphene oxide layer by providing the coating composition of claim 1, wherein the graphene oxide is positively electric-charged, on a carrier substrate;
forming a second graphene oxide layer by providing a second coating composition including a negatively electric-charged graphene oxide on the carrier substrate, the graphene oxide layer being interlayer-bonded to the first graphene oxide layer by electrostatic force;
forming a flexible substrate on a barrier adhesion layer including the first graphene oxide layer and the second graphene oxide layer;
forming a display element part on the flexible substrate;
forming a protective film on the display element part; and
separating the flexible substrate from the carrier substrate.

14. The method of claim 13, wherein the flexible substrate includes at least one selected from the group consisting of polyester, polyvinyl, polycarbonate, polyethylene, polypropylene, polyacetate, polyimide, polyethersulphone, polyacrylate, polyethylenenaphthelate, and polyethyleneterephehalate.

15. The method of claim 13, wherein the amine includes at least one selected from the group consisting of N,N-dimethyl-p-phenylene diamine, p-phenylene diamine, 3-dimethylamino-1-propyl amine, and 2,2-(1,2-phenylene)bis(1H-benzo[d]imidazol-5-amine).

16. The method of claim 13, wherein the positively electric-charged graphene oxide has a thickness of about 0.5 nm to about 2 nm.

17. The method of claim 13, wherein the negatively electric-charged graphene oxide has an oxygen content of about 35 wt % to about 48 wt %.

* * * * *